(12) United States Patent
Sano et al.

(10) Patent No.: US 8,362,493 B2
(45) Date of Patent: Jan. 29, 2013

(54) CONFIGURATIONS OF A SEMICONDUCTOR LIGHT EMITTING DEVICE AND PLANAR LIGHT SOURCE

(75) Inventors: Takeshi Sano, Saitama (JP); Kouji Tsukagoshi, Gunma (JP); Masanori Hoshino, Saitama (JP)

(73) Assignee: Sanken Electric Co., Ltd., Niiza-Shi, Saitama-Ken (JP)

( * ) Notice: Subject to any disclaimer, the term of this patent is extended or adjusted under 35 U.S.C. 154(b) by 428 days.

(21) Appl. No.: 12/262,566

(22) Filed: Oct. 31, 2008

(65) Prior Publication Data
US 2009/0121248 A1    May 14, 2009

(30) Foreign Application Priority Data
Nov. 2, 2007    (JP) ................................ 2007-008501

(51) Int. Cl.
*H01L 33/00*    (2010.01)
(52) U.S. Cl. .............. 257/79; 257/81; 257/99; 257/100; 257/E33.006; 257/E33.056; 257/E33.066
(58) Field of Classification Search ............ 257/79, 257/98, 99, 100, E33.001, 81, E33.006, E33.056, 257/E33.066
See application file for complete search history.

(56) References Cited

U.S. PATENT DOCUMENTS

| | | | |
|---|---|---|---|
| 6,924,514 B2 * | 8/2005 | Suenaga | ........................ 257/98 |
| 6,943,433 B2 | 9/2005 | Kamada | |
| 6,958,250 B2 * | 10/2005 | Yang | ............................... 438/22 |
| 2003/0168720 A1 | 9/2003 | Kamada | |
| 2007/0126011 A1 * | 6/2007 | Lee | ................................. 257/89 |
| 2009/0200566 A1 | 8/2009 | Bukesov | |
| 2010/0308364 A1 | 12/2010 | Bukesov | |

FOREIGN PATENT DOCUMENTS

| | | |
|---|---|---|
| CN | 1298059 C | 5/2005 |
| JP | 2003-332634 A | 11/2003 |
| JP | 2004221163 A | 8/2004 |
| JP | 2007041471 | 2/2007 |
| JP | 2007180591 | 7/2007 |
| TW | 200739970 | 10/2007 |

OTHER PUBLICATIONS

Machine Translation of Ref. CN-200410096067.*
Human Translation of CN 1298059C.*
The State Intellectual Property Office of the People's Republic of China, Notification of First Office Action (English translation and original Chinese office action included) (Jan. 8, 2010) (11 pages).
Office Action for Taiwanese Patent Application No. 097142001 mailed Nov. 7, 2012. 9 pages.
Office Action for Korean Patent Application No. 10-2008-0106863 mailed Oct. 19, 2012. 8 pages.

* cited by examiner

*Primary Examiner* — Ha Tran T Nguyen
*Assistant Examiner* — Suberr Chi
(74) *Attorney, Agent, or Firm* — Wilmer Cutler Pickering Hale and Dorr LLP

(57) ABSTRACT

A semiconductor light emitting device includes: a base portion having a concave portion formed in one of major surfaces thereof; and a light emitting element mounted on a bottom surface of the concave portion of the base portion. The base portion comprises a side wall portion that surrounds the light emitting element. The light emitting element is covered with a resin portion filled in the concave portion. At least a part of an upper surface of the resin portion is positioned closer to the bottom surface of the concave portion than an upper surface of the side wall portion.

10 Claims, 2 Drawing Sheets

CONFIGURATIONS OF A SEMICONDUCTOR LIGHT EMITTING DEVICE AND PLANAR LIGHT SOURCE

CROSS-REFERENCE TO RELATED APPLICATIONS

This application is based upon and claims priority from Japanese Utility Model Application No. 2007-008501 filed on Nov. 2, 2007, the entire contents of which are incorporated herein by reference.

BACKGROUND OF THE INVENTION

1. Technical Field

The present invention relates to a semiconductor light emitting device, and a planar light source including the semiconductor light emitting device.

2. Description of the Related Art

FIG. 4 shows a surface-mount semiconductor light emitting device 100. As shown in FIG. 4, the surface-mount semiconductor light emitting device 100 includes: a base portion 102; a light emitting diode chip 105; and a resign portion 103. A concave portion is formed in an upper surface of the base portion 102. The light emitting diode chip 105 serves as a light emitting element fixed on a bottom surface of the concave portion by soldering. The resin portion 103 covers the light emitting diode chip 105. The base portion 102 includes a heat radiating plate 106 containing a metal, on which the light emitting diode chip 105 is fixed by soldering, and a surrounding body 104 which surrounds the heat radiating plate 106. In this case, the surrounding body 104 includes a side wall portion 109 of the base portion 102. Lead terminals 107 are led out from a pair of side surfaces of the surrounding body 104 opposite to each other and are electrically connected to the light emitting diode chip 105 via respective wires 108. The combination of the semiconductor light emitting device 100 with a light guide plate configures a planar light source for use in, for example, a backlight for a liquid crystal display. In the planar light source, an upper surface 109a of the side wall portion 109 of the base portion 102 is arranged opposite to a light incident surface of the light guide plate such that light emitted from the light emitting diode 105 enters via the resin portion 103 to the light incident surface of the light guide plate. The light entering to the light guide plate is output from one major surface of the light guide plate to outside of the light guide plate. In order to obtain sharp directivity of light emitted from the semiconductor light emitting device 100 so as to improve luminance of light emitted from the major surface of the light guide plate to the outside, the upper surface 103a of the resin portion 103 covering the light emitting diode chip 105 is positioned substantially flush with the upper surface 109a of the side wall portion 109, or the resin portion 103 protrudes from the upper surface 109a of the side wall portion 109 such that the upper surface 103a is positioned on an upper side of (higher than) the upper surface 109a of the side wall portion 109. JP-A-2007-041471 describes such a planar light source.

In the planar light source, the semiconductor light emitting device is disposed in the vicinity of the light guide plate based upon the below-mentioned reasons:

(1) When a gap or a cavity (hereinafter referred to as "cavity portion") is provided between the semiconductor light emitting device and the light guide plate, light is refracted due to a difference between a refractive index of an air layer present in the cavity portion and a refractive index of the resin portion, so that an amount of light entering into the light guide plate is decreased. As a result, it is difficult to obtain desirable luminance of the light output from one major surface of the light guide plate to the external portion.

(2) When the cavity portion is provided between the semiconductor light emitting device and the light guide plate, the surface size of the planar light source becomes large.

However, when the semiconductor light emitting device is arranged in the vicinity of the light guide plate, light emitting performance of the light emitting diode chip may be deteriorated. The reason of the deterioration of the light emitting performance is that, in the semiconductor light emitting device, the resin portion of the semiconductor light emitting device is heated by heat generations of the light emitting diode chip, so that the resin portion may be easily and thermally expanded. When the resin portion of the semiconductor light emitting device is thermally expanded and then the expanded resin portion is brought into contact with the light incident surface of the light guide plate, depression force is applied through the expanded resin portion of the semiconductor light emitting device to the light emitting diode chip, since the light guide plate is harder than the resin portion of the semiconductor light emitting device. As a result, mechanical stresses capable of deteriorating the light emitting performance may be produced in the light emitting diode chip, in addition, bonding wires may be cut or stripped from electrodes.

Also, in case where a plurality of semiconductor light emitting devices are arranged in parallel with the light incident surface of the light guide plate, if degrees of protrusion of upper surfaces of resign portions of the plural semiconductor light emitting devices are fluctuated in manufacturing steps, when the resin portions of the semiconductor light emitting devices are thermally expanded, some semiconductor light emitting devices whose protrusion degrees are relatively small do not contact with the light incident surface of the light guide plate, but another semiconductor light emitting devices whose protrusion degrees are relatively large may contact with the light incident surface of the light guide plate. As a result, at the portions where the semiconductor light emitting devices contact with the light incident surface of the light guide plate, the capacity portion disappears, so that light received by the light guide plate from the semiconductor light emitting devices increases. As a consequence, brightness of the planar light source is fluctuated depending upon locations of the semiconductor light emitting devices. Accordingly, the display grade of the planar light source may be lowered.

BRIEF SUMMARY OF THE INVENTION

The present invention has an object to provide a semiconductor light emitting device and a planar light source, which can solve the above-described technical problems.

According to an aspect of the invention, there is provided a semiconductor light emitting device comprising: a base portion having a concave portion formed in one of major surfaces thereof; and a light emitting element mounted on a bottom surface of the concave portion of the base portion, wherein the base portion comprises a side wall portion that surrounds the light emitting element, wherein the light emitting element is covered with a resin portion filled in the concave portion, and at least a part of an upper surface of the resin portion is positioned closer to the bottom surface of the concave portion than an upper surface of the side wall portion.

According to another aspect of the invention, there is provided a planar light source comprising: a semiconductor light emitting device comprising: a base portion having a concave portion formed in one of major surfaces thereof; and a light emitting element mounted on a bottom surface of the concave portion of the base portion, wherein the base portion comprises a side wall portion that surrounds the light emitting element, wherein the light emitting element is covered with a resin portion filled in the concave portion, and wherein at least a part of an upper surface of the resin portion is positioned closer to the bottom surface of the concave portion than an upper surface of said side wall portion; and a light guide plate into which light emitted from the light emitting element is introduced, wherein the upper surface of the side wall portion of the base portion is arranged opposite to a side surface of said light guide plate.

DETAILED DESCRIPTION OF THE EMBODIMENT

Next, a semiconductor light emitting device according to an embodiment of the invention is described.

Figure 1:
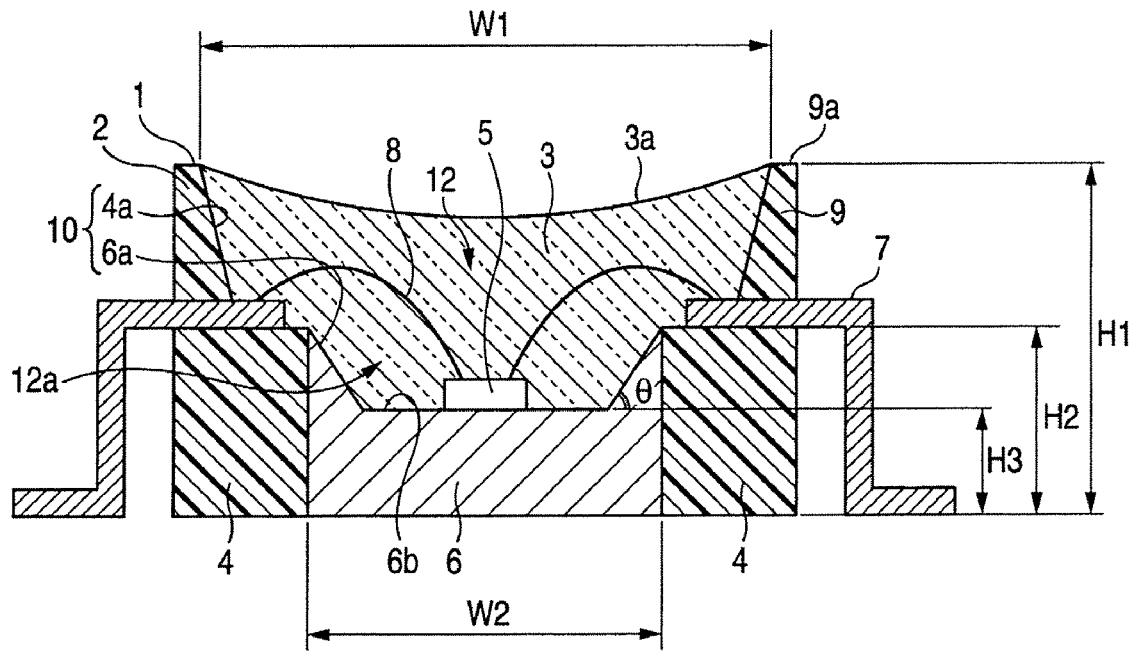
FIG. 1 is a cross-sectional view showing a semiconductor light emitting device according to an embodiment of the present invention.

As shown in FIG. 1, a semiconductor light emitting device 1 of an embodiment of the present invention includes a supporting plate 6 containing a metal material, a light emitting diode chip 5, lead terminals 7, wires 8, and a surrounding body 4. The light emitting diode 5 serves as a light emitting element fixed on an upper surface of the supporting plate 6. The lead terminals 7 are arranged adjacent to a side surface of the supporting plate 6 and extend from the side of the supporting plate 6 to the outer side. The wires 8 electrically connect upper surface electrodes of the light emitting diode chip 5 to the lead terminals 7. The surrounding body 4 covers a part of the lead terminals 7 and the side surface of the supporting plate 6.

Figure 2:
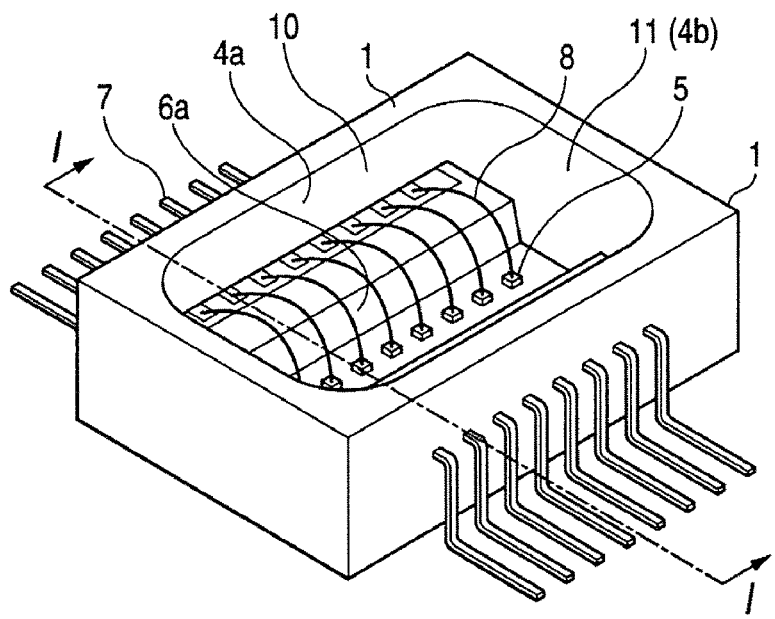
FIG. 2 is a perspective view of the semiconductor light emitting device of FIG. 1.

FIG. 2 shows a semiconductor light emitting device 1 which is accomplished. In the semiconductor light emitting device shown in this drawing, 8 pieces of the light emitting diodes 5 are fixed on the upper surface of the supporting plate 6, 16 pieces of the lead terminals 7 electrically connected to the light emitting diode chips 5 are provided. The supporting plate 6 and the outer surrounding body 4 define a base portion 2. Also, in the semiconductor light emitting device 1, as shown in FIG. 2, for example, plural sets of blue light emitting diodes may be arrayed as the light emitting diode chips 5. Alternatively, a single light emitting diode may be arranged as the light emitting diode chip 5, or by a blue light emitting diode and other light emitting diodes such as a red light emitting diode, which emit light having other wavelengths than the wavelength of the blue light emitting diode, may be arrayed.

The supporting plate 6 and the lead terminals 7 contain metals having high thermal conductivities, for instance, copper, aluminum, a copper alloy, an aluminum alloy, or the like. As shown in FIG. 2, the base portion 2 has one pair of first side surfaces 10 located opposite to each other, and one pair of second side surfaces 11. The second side surfaces 11 are formed between one pair of the first side surfaces 10, the lengths of which are shorter than the first side surfaces 10. The supporting plate 6 has a substantially rectangular shape in plan view.

The supporting plate 6 has a groove-shaped concave portion 12a in the upper surface thereof. The concave portion 12a passes through a center side of the upper surface of the supporting plate 6 and reaches the second side surfaces 11 located opposite to each other. The light emitting diode chip 5 is fixed on a bottom surface 6b of the concave portion 12a of the supporting plate 6. One pair of the first side surfaces 10 of the supporting plate 6 extend upwardly from the bottom surface 6b of the concave portion 12a to define a part of a side wall portion 9 including a part of the surrounding body 4. The side wall portion 9 has inclined faces such that the distance between opposite faces increase toward a direction (upper direction) separated from the bottom surface. The side wall portion 9 serves as a reflector capable of improving optical directivity and the like of the light emitting diode chip 5. A lower surface of the supporting plate 6 is exposed from a lower surface of the surrounding body 4 to outside, such that heat generated from the light emitting diode chip 5 can be radiated to the outside under better condition. One end of each of the lead terminals 7 is electrically connected via the wires 8 to an upper electrode or a lower electrode of the light emitting diode chip 5, whereas the other end thereof is lead out from the surrounding body 4 to the outside.

The surrounding body 4 includes a resin in which containing ratio of compounds (filler materials) such as, for instance, silica and a titanium oxide is relatively large. For example, the surrounding body 4 includes a white colored resin containing a nylon resin or liquid crystal polymer. Four side surfaces of the surrounding body 4 extend above the upper surface of the supporting plate 6, which define the side wall portion 9 for surrounding the light emitting diode chip 5. The resin portion 3 having the optical transmitting characteristic is provided within a concave portion defined by the side wall portion 9.

The resin portion 3 covers the upper surface of the supporting plate 6, the light emitting diode chip 5, and the upper surfaces of the wires 8 and the lead terminals 7. When the outer surrounding body 4 is formed by a material having an optical reflecting characteristic such as a white-colored resin containing the nylon resin or liquid crystal polymer, the outer surrounding body 4 may serve as a reflector capable of improving the optical directivity of the light emitting diode chip 5, similar to the concave portion of the supporting plate 6. The concave portion of the surrounding body 4 is continuous with the concave portion of the supporting plate 6, which defines a concave portion 12 of a base portion 2. The resin portion 3 having the optical transmitting characteristic is formed in this concave portion 12.

In other words, the concave portion 12 of the base portion 2 includes: a concave portion 12a defined by the groove portion formed in the upper surface of the supporting plate 6; and a space surrounded by inner face of the surrounding body 4 upwardly extending from the upper surface of the supporting plate 6. The first side surface 10 is defined by an inner side face 4a of the surrounding body 4 and an inner side face 6a of the supporting plate 6 at the concave portion 12a, and the second side surface 11 is defined by an inner side face 4b of the surrounding body 4.

The inner side face 6a is inclined outward from the bottom surface 6b of the concave portion 12a in cross-sectional view shown in FIG. 1. Therefore, the inner side face 6a can upwardly reflect the light emitted from the light emitting diode chip 5. The angle θ defined between the inner side face 6a and the bottom face 6b is preferably from 30 to 60°, preferably around 52°. In addition, the angle defined between the second side surface 11 and the bottom face 6b is preferably about 45°. The inner side face 6a contains, for example, silver (or silver alloy) to have high reflectance. Since the second side face 11 is defined by the inner side face 4b of the surrounding body 4 containing the white-colored resin, the inner side face 6a as a part of the first side surface 10 has higher reflectance than the second side face 11.

The resin portion 3 includes a resin having a high refractive index and a high optical transmitting characteristic and covers the light emitting diode chip 5 and the wires 8. In the semiconductor light emitting device 1 of the present embodiment, the resin portion 3 contains a heat-resistant silicone resin. As a consequence, the adhesion property between the side wall portion 9 and the resin portion 3 is high. The resin portion 3 contains phosphor in order to convert wavelengths of light emitted from the light emitting diode chip 5. As a result, the light emitted from the light emitting diode chip 5 is mixed with the light whose wavelengths have been converted by the phosphor, and the mixed light (e.g., white light) can be emitted through the resin portion 3.

In the semiconductor light emitting device 1 of the present embodiment, the upper surface 3a of the resin portion 3 is located closer to the bottom surface of the concave portion formed in the supporting plate 6 than the upper surface 9a of the side wall portion 9 (that is, upper surface 3a of resin portion 3 is located lower than the upper surface 9a of the side wall portion 9). More specifically, in the semiconductor light emitting device 1 of the present embodiment, the upper surface 3a of the resin portion 3 is formed in a shape where the upper surface 9a is curved toward the lower side such that a center portion of the upper surface 3a of the resin portion 3 is closer to the upper surface of the light emitting diode chip 5 than the peripheral portion thereof. In other words, in the upper surface 3a of the resin portion 3, an inside of a region, onto which four edges of the light emitting diode chip 5 is projected, is positioned lower than an outside of the projected region.

An example of the dimension of the semiconductor light emitting device 1 of the embodiment is as follows:

Width of an upper surface 3a of the resin portion 3 (W1)= 4.23 [mm];

Width of the supporting plate 6 (W2)=2.4 [mm];

Height of the base portion 2 (H1)=2.5 [mm];

Height of the supporting plate 6 (H2)=1.5 [mm]; and

Height of the supporting plate 6 at the bottom surface 6b of the concave portion 12a (H3)=1.0 [mm].

An example of a linear expansion coefficient of the resin portion 3 is not lower than 200 ppm/° C. but not higher than 350 ppm/° C., and an example of a linear expansion coefficient of the supporting plate 6 and the surrounding body 4 is not lower than 20 ppm/° C. but not higher than 60 ppm/° C. That is, the resin portion 3 has a sufficiently large linear expansion coefficient as compared with the supporting plate 6 and the surrounding body 4.

Figure 3:
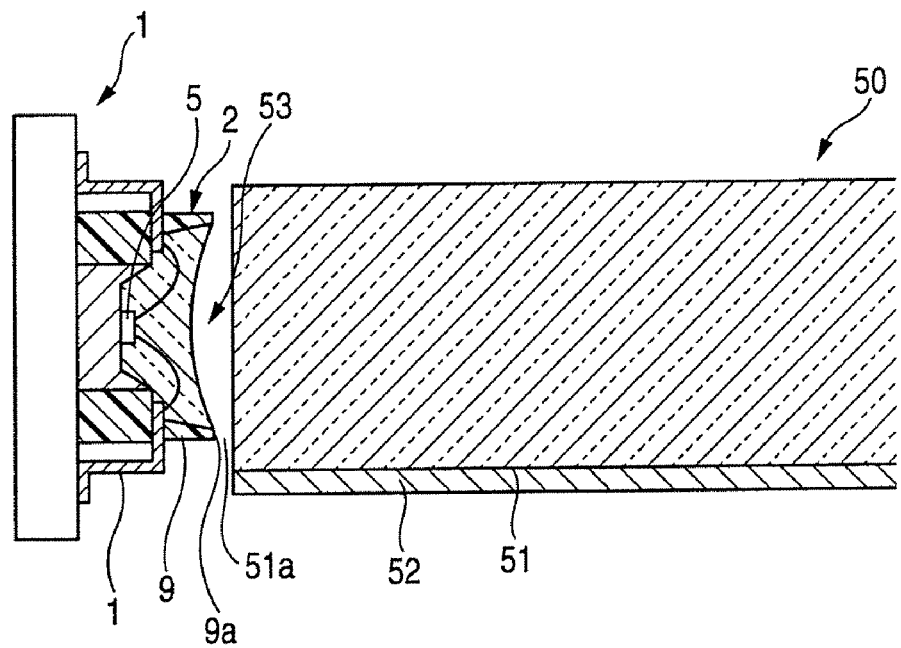
FIG. 3 shows a planar light source according to an embodiment.
Figure 4:
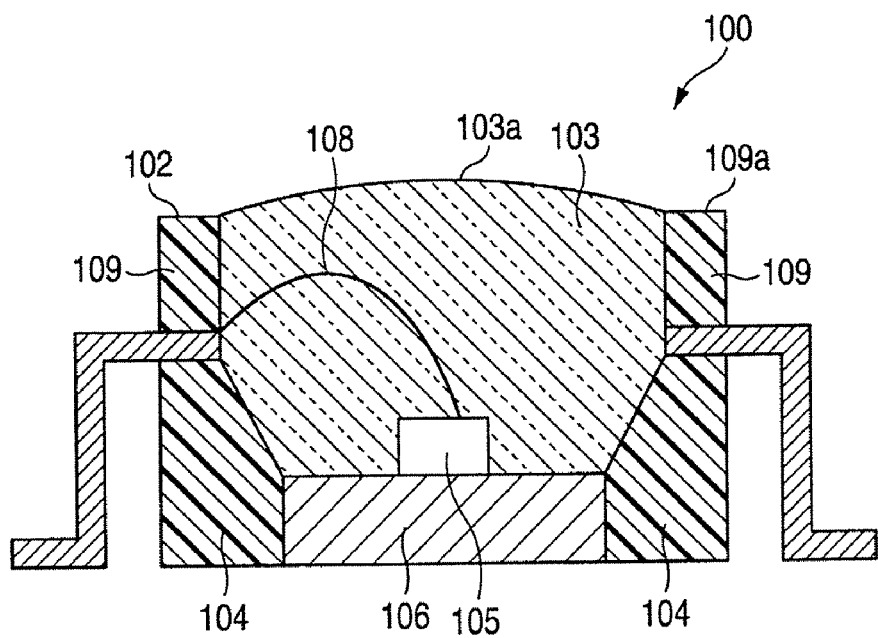
FIG. 4 shows a related-art surface-mount semiconductor light emitting device.

FIG. 3 shows a planar light source 50 including the semiconductor light emitting device 1. The planar light source 50 includes the semiconductor light emitting device 1 and a planar light guide plate 51 containing a resin having an optical transmitting characteristic. With respect to the semiconductor light emitting device 1 and the light guide plate 51, the upper surface 9a of the side wall portion 9 of the base portion 2 of the semiconductor light emitting device 1 is arranged opposite to a side surface (i.e., light incident surface) 51a of the light guide plate 51. A reflection plate 52 is arranged on a lower surface of the light guide plate 51. As a consequence, light received by the light guide plate 51 from the semiconductor light emitting device 1 is reflected by the reflection plate 52, and then, the reflected light is output from an upper surface (one major surface) of the light guide plate 51 to the outside of the light guide plate 51.

In the semiconductor light emitting device 1 of the embodiment, since the upper surface 3a of the resin portion 3 is formed on the lower side than the upper surface of the side wall portion 13, a cavity portion 53 is formed between the upper surface 3a of the resin portion 3 and the side surface 51a of the light guide plate 51. As a result, even when the resin portion 3 is thermally expanded, the expanded resin portion 3 is not brought into contact with the side surface 51a of the light incident surface 51. Therefore, depression force is not applied to the light emitting diode chip 5 via the resin portion 3. As a result, mechanical stresses causing deterioration of the light emitting performance are not applied to the light emitting diode chip 5.

Also, in case where the upper surfaces 3a of the resin portions 3 of the semiconductor light emitting devices 1 have convex shapes, one convex-shaped upper surface may contact with the light guide plate 51, and another convex-shaped upper surface may not contact with the light guide plate 51 are formed. As a result, luminance fluctuations of the planar light source may occur. However, according to this embodiment, the upper surface 3a of the resin portion 3 has the concave shape, and then this concave-shaped upper surface 3a does not contact with the light guide plate 51, so that the luminance fluctuations do not occur.

In particular, there is a need for thinning light guide plates in order to achieve reductions of manufacturing cost and slim products. In relation to this need, it is necessary to narrow widths of planar light emitting sources. As a consequence, the width of the supporting plate 6 is required to be narrowed, so that it is practically difficult that heat generated from the light emitting diode chip 5 is appropriately radiated to the outside from the semiconductor light emitting device 1. As a result, while a point of the upper surface 3a of the resin portion 3 contacting with the side wall portion 9 is defined as a starting point, the upper surface 3a of the resin portion 3 may be readily raised on the center side close to the light emitting diode chip 5. Even when the upper surface 3a of the resin portion 3 located above the light emitting diode chip 5 is raised, the position of the side wall portion 9 is located on the upper side than the position of the upper surface 3a of the resin portion 3, so that it is possible to avoid that the position of the upper surface 3a of the resin portion 3 becomes the highest position. Accordingly, the width of the planar light source can be narrow, and the planar light emitting source suitable for the thin light guide plate can be provided.

The present invention is not limited only to the above-described embodiment, but may be modified. For example, in the above embodiment, the upper surface 9a of the side wall portion 9 of the semiconductor light emitting device 1 is slightly separated from the side surface 51a of the light guide plate 51. Alternatively, both the upper surface 9a and the side surface 51a may contact with each other. In this alternative case, when the resin portion 3 is thermally expanded, there are some possibilities that the upper surface 3a of this resin portion 3 may contacted with the side surface 51a of the light guide plate 51. However, since the upper surface 3a of the resin portion 3 is formed on the lower side than the upper surface 9a of the side wall portion 9, it is possible to avoid that a large amount of depression force is applied to the light emitting diode chip 5. Also, in order to increase the heat radiating characteristic of the semiconductor light emitting device 1, a heat radiating plate containing a metal may be alternatively arranged on the lower surface side of the supporting plate 6.

According to the embodiment of the present invention, even when the resin portion is expanded due to the heat generated by the light emitting element, the upper surface of the resin portion can hardly protrude upwardly from the upper surface of the side wall portion. Therefore, when a semiconductor light emitting device is combined with a light guide plate so as to configure a planar light source, even if the resin portion is thermally expanded, the resin portion does not contact with a light incident surface of the light guide plate, and large depression force is not applied via the resin portion to the light emitting element. As a result, mechanical stresses causing deterioration of light emitting performance of the light emitting element are not generated in the light emitting element.

In the planar light source according to the embodiment of the invention, the stable light emitting performance of the semiconductor light emitting device can be obtained over a long time period. As a result, it is possible to realize the planar light source having high reliability. In addition, it is possible to suppress that brightness of the planar light source is fluctuated depending upon locations of the planar light source, so that the display grade of the planar light source can be improved.

What is claimed is:

1. A semiconductor light emitting device comprising:
a base portion having a concave portion formed in one of major surfaces thereof; and
a light emitting element mounted on a bottom surface of the concave portion of the base portion,
wherein the base portion comprises:
one pair of first side surfaces located opposite to each other; and
one pair of second side surfaces, wherein the second side surfaces are formed between one pair of the first side surfaces, and the lengths of which are shorter than the first side surfaces,
wherein one pair of the first side surfaces and one pair of the second side surfaces define a side wall portion, which extends from the base portion, and which laterally surrounds the light emitting element,
wherein the concave portion reaches the second side surfaces,
wherein the light emitting element is covered with a resin portion filled in the concave portion, and a space defined by the side wall portion,
wherein an upper surface of the resin portion exposed to an outside from the space defined by the side wall portion forms a concave shape such that at least a part of the upper surface of the resin portion is positioned closer to the bottom surface of the concave portion than an upper surface of the side wall portion,
wherein the base portion has a substantially rectangular shape,
wherein the light emitting device comprises a blue light emitting diode, and
wherein the resin portion contains phosphor in order to convert wavelengths of light emitted from the light emitting device so that the light emitted from the light emitting device is mixed with the light whose wavelengths have been converted by the phosphor and the mixed light is emitted through the resin portion.

2. The semiconductor light emitting device according to claim 1, wherein an entire part of the upper surface of the resin portion is not positioned farther away from the bottom surface of the concave portion than the upper surface of the side wall portion.

3. The semiconductor light emitting device according to claim 1, wherein a height defined between the upper surface of the resin portion and a plane containing the bottom surface of the concave portion decreases toward a center of the resin portion in cross-sectional view.

4. The semiconductor light emitting device according to claim 1,
wherein the base portion comprises: a supporting plate containing metal; and a surrounding portion that laterally surrounds the supporting plate and includes an extending portion extending upward from an upper surface of the supporting plate, and
wherein the light emitting element is disposed on the supporting plate.

5. The semiconductor light emitting device according to claim 4,
wherein the supporting plate has a groove portion formed thereon, and
wherein the light emitting element is disposed on a bottom surface of the groove portion.

6. The semiconductor light emitting device according to claim 1, wherein the light emitting element is contained within a first portion of the base whose walls are substantially continuous with a second portion of the base.

7. The semiconductor light emitting device according to claim 1, wherein the light emitting element consists of a blue light emitting diode.

8. A planar light source comprising:
a semiconductor light emitting device comprising:
a base portion having a concave portion formed in one of major surfaces thereof; and
a light emitting element mounted on a bottom surface of the concave portion of the base portion,
wherein the base portion comprises:
one pair of first side surfaces located opposite to each other; and
one pair of second side surfaces, wherein the second side surfaces are formed between one pair of the first side surfaces, and the lengths of which are shorter than the first side surfaces,
wherein one pair of the first side surfaces and one pair of the second side surfaces define a side wall portion which extends from the bottom portion, and which laterally surrounds the light emitting element,
wherein the concave portion reaches the second side surfaces,
wherein the light emitting element is covered with a resin portion filled in the concave portion and a space defined by the side wall portion,
wherein an upper surface of the resin portion exposed to an outside from the space defined by the side wall portion forms a concave shape such that at least a part of aft the upper surface of the resin portion is positioned closer to the bottom surface of the concave portion than an upper surface of said side wall portion;
wherein the base portion has a substantially rectangular shape,
wherein the light emitting device comprises a blue light emitting diode, and
wherein the resin portion contains phosphor in order to convert wavelengths of light emitted from the light emitting device so that the light emitted from the light emitting device is mixed with the light whose wavelengths have been converted by the phosphor and the mixed light is emitted through the resin portion; and
a light guide plate into which light emitted from the light emitting element is introduced,
wherein the upper surface of the side wall portion of the base portion is arranged opposite to a side surface of said light guide plate.

9. The semiconductor light emitting device according to claim 1, wherein the resin portion has a liner expansion coefficient not less than 200 ppm/° C.

10. The planar light source according to claim 8, wherein the resin portion has a linear expansion coefficient not less than 200 ppm/° C.

* * * * *